United States Patent
Pyo et al.

(10) Patent No.: US 7,894,282 B2
(45) Date of Patent: *Feb. 22, 2011

(54) DYNAMIC RANDOM ACCESS MEMORY DEVICE AND METHOD OF DETERMINING REFRESH CYCLE THEREOF

(75) Inventors: Suk-Soo Pyo, Yongin-si (KR); Uk-Song Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 135 days.

This patent is subject to a terminal disclaimer.

(21) Appl. No.: 12/329,880

(22) Filed: Dec. 8, 2008

(65) Prior Publication Data

US 2009/0168571 A1    Jul. 2, 2009

Related U.S. Application Data

(63) Continuation-in-part of application No. 11/604,708, filed on Nov. 28, 2006, now Pat. No. 7,477,563.

(30) Foreign Application Priority Data

Nov. 29, 2005    (KR) .................... 10-2005-0115006

(51) Int. Cl.
    *G11C 7/00* (2006.01)
(52) U.S. Cl. ............... 365/200; 365/222; 365/230.08
(58) Field of Classification Search ........... 365/200, 365/222, 230.08, 185.09, 189.05; 711/48, 711/763–764
See application file for complete search history.

(56) References Cited

U.S. PATENT DOCUMENTS

| | | | |
|---|---|---|---|
| 4,935,900 A * | 6/1990 | Ohsawa | 365/222 |
| 6,697,992 B2 | 2/2004 | Ito et al. | |
| 6,795,362 B2 | 9/2004 | Nakai et al. | |
| 7,319,612 B2 * | 1/2008 | Babb et al. | 365/185.08 |
| 7,458,004 B2 * | 11/2008 | Takahashi | 714/763 |
| 7,477,563 B2 * | 1/2009 | Kang et al. | 365/222 |

FOREIGN PATENT DOCUMENTS

| | | |
|---|---|---|
| JP | 2002025299 A | 1/2002 |
| JP | 2002056671 A | 2/2002 |
| JP | 2003132677 A | 5/2003 |
| KR | 1020050078242 A | 8/2005 |

\* cited by examiner

*Primary Examiner*—David Lam
(74) *Attorney, Agent, or Firm*—Volentine & Whitt, PLLC

(57) ABSTRACT

Provided are a dynamic random access memory device having reduced power consumption and a method of determining a refresh cycle of the dynamic random access memory device. The method includes: selecting one or more monitoring bits during first through n-th self refresh cycles, where "n" is a natural number equal to or greater than one; detecting whether the monitoring bits have errors during (n+1)-th through m-th self refresh cycles, where "m" is a natural number equal to or greater than n+1; and adjusting an (m+1)-th self refresh cycle according to whether the monitoring bits have errors.

9 Claims, 10 Drawing Sheets

DYNAMIC RANDOM ACCESS MEMORY DEVICE AND METHOD OF DETERMINING REFRESH CYCLE THEREOF

This application is a continuation-in-part of U.S. patent application Ser. No. 11/604,708, filed Nov. 28, 2006, which is incorporated herein by reference in its entirety.

BACKGROUND OF THE INVENTION

1. Field of the Invention

The present invention relates to a dynamic random access memory device and a method of determining a refresh cycle thereof.

2. Description of the Related Art

Dynamic random access memory devices include a plurality of memory cells, each of which has a transistor that serves as a switch and a capacitor that stores data. However, initial data stored in the capacitor may be lost due to leakage current generated in a PN junction of a MOS transistor. Accordingly, in dynamic random access memory devices, a refresh operation is required to recharge data in the memory cell before data is lost. The refresh operation includes an automatic refresh operation, a self refresh operation, and so on. In the self refresh operation, refresh is performed while the dynamic random access memory device sequentially changes an internal address in response to a refresh instruction signal.

The self refresh operation is repeated according to an internally defined cycle. The recharge cycle is referred to as a refresh cycle tREF. The refresh cycle is determined based on the data retention characteristics, which are not constant due to changes in process, voltage, and temperature (PVT). However, during this refresh operation, the dynamic random access memory device consumes high standby power as compared to a static RAM (SRAM) or flash memory device. Accordingly, there is a need for a refresh cycle associated with a dynamic random access memory device which requires reduced power consumption.

SUMMARY OF THE INVENTION

Aspects of the present invention provide a method of determining a refresh cycle of a dynamic random access memory device having reduced power consumption.

Aspects of the present invention also provide a dynamic random access memory device having reduced power consumption.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a method of determining a refresh cycle of a dynamic random access memory device. The method includes: selecting one or more monitoring bits during first through n-th self refresh cycles, where "n" is a natural number equal to or greater than one; detecting whether the monitoring bits have errors during (n+1)-th through m-th self refresh cycles, where "m" is a natural number equal to or greater than n+1; and adjusting an (m+1)-th self refresh cycle according to whether the monitoring bits have errors.

According to another aspect of the present invention, there is provided a dynamic random access memory device including: an error correction code (ECC) engine selecting one or more monitoring bits during a self refresh period and detecting whether the selected monitoring bits have errors; a monitoring address storage unit storing monitoring addresses of the selected monitoring bits; and a refresh cycle determining circuit adjusting a self refresh cycle according to whether the selected monitoring bits have errors.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
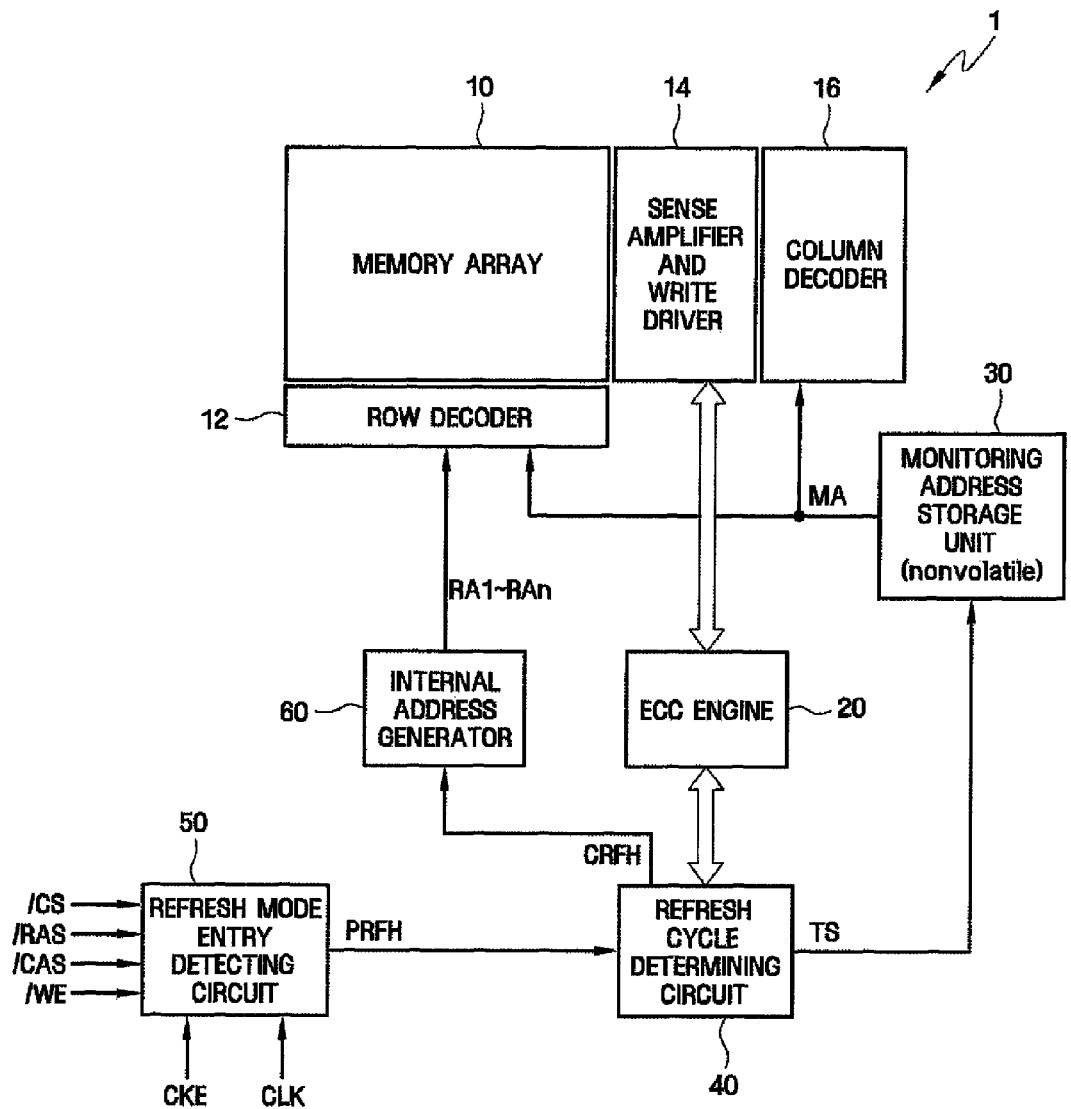
FIG. 1 is a block diagram illustrating a dynamic random access memory device according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a dynamic random access memory device according to an embodiment of the present invention. Dynamic random access memory device 1 includes a memory array 10, an ECC engine (Error Correction Code engine) 20, a monitoring address storage unit 30, and a refresh cycle determining circuit 40. Memory array 10 includes a plurality of memory cells arranged in a two-dimensional manner (e.g. matrix configuration). In the memory array 10 shown in FIG. 1, one memory bank is illustrated, but multiple memory banks may be utilized. The memory cells of memory array 10 arranged in a row are electrically connected to word lines, and the memory cells arranged in a column are electrically connected to bit lines (or complementary bit lines).

Row decoder 12 selects a word line of memory array 10 according to the decoding result of a row address signal. During a read operation, sense amplifier and write driver 14 amplifies a potential difference of a pair of data lines individually connected to a pair of bit lines to read data stored in a memory cell. During a write operation, the sense amplifier and write driver 14 transmits predetermined data through the pair of data lines and the pair of bit lines to store data in the memory cell. A column decoder 16 communicates with memory array 10 to select a memory cell, from and into which data is to be read and written according to the decoding result of a column address signal.

When a refresh operation is not performed on a memory array for a predetermined time, data stored in a memory cell capacitor of the memory array may be lost. This refresh operation requires power consumption. However, in order to reduce standby power consumption, a self refresh cycle tREF needs to be performed using an error detection and correction scheme without damaging data stored in the memory cell capacitor. Additional information associated with the stored data is required to detect and correct this data error. In particular, multiple data bits and an ECC (Error Correction Code) bit are stored in memory array 10. The ECC bit may be generated using various types of encoding systems, such as hamming codes, Huffman codes, parity codes, turbo codes, cyclic codes, low-density parity-check codes, Reed-Muller codes, Reed-Solomon error correction codes, or the like. ECC engine 20 generates an ECC bit corresponding to the data bits using the data bits stored in the memory array 10 before the memory array performs a self refresh operation and stores the ECC bit in a predetermined region of the memory array 10. One ECC bit can be added and stored in memory array 10 for every 8-bit data bits. This ECC data bit is used during the self refresh operation to determine the presence of a data error and to correct any error in the data bits and/or at the end of the self refresh operation. Additionally, errors are detected in some, but not all of the data bits. This detection method reduces power consumption as compared with operations that detect errors in all of the data bits. The selected data bits and the ECC bit stored in memory array 10 are hereinafter referred to as "monitoring bits."

Figure 6:
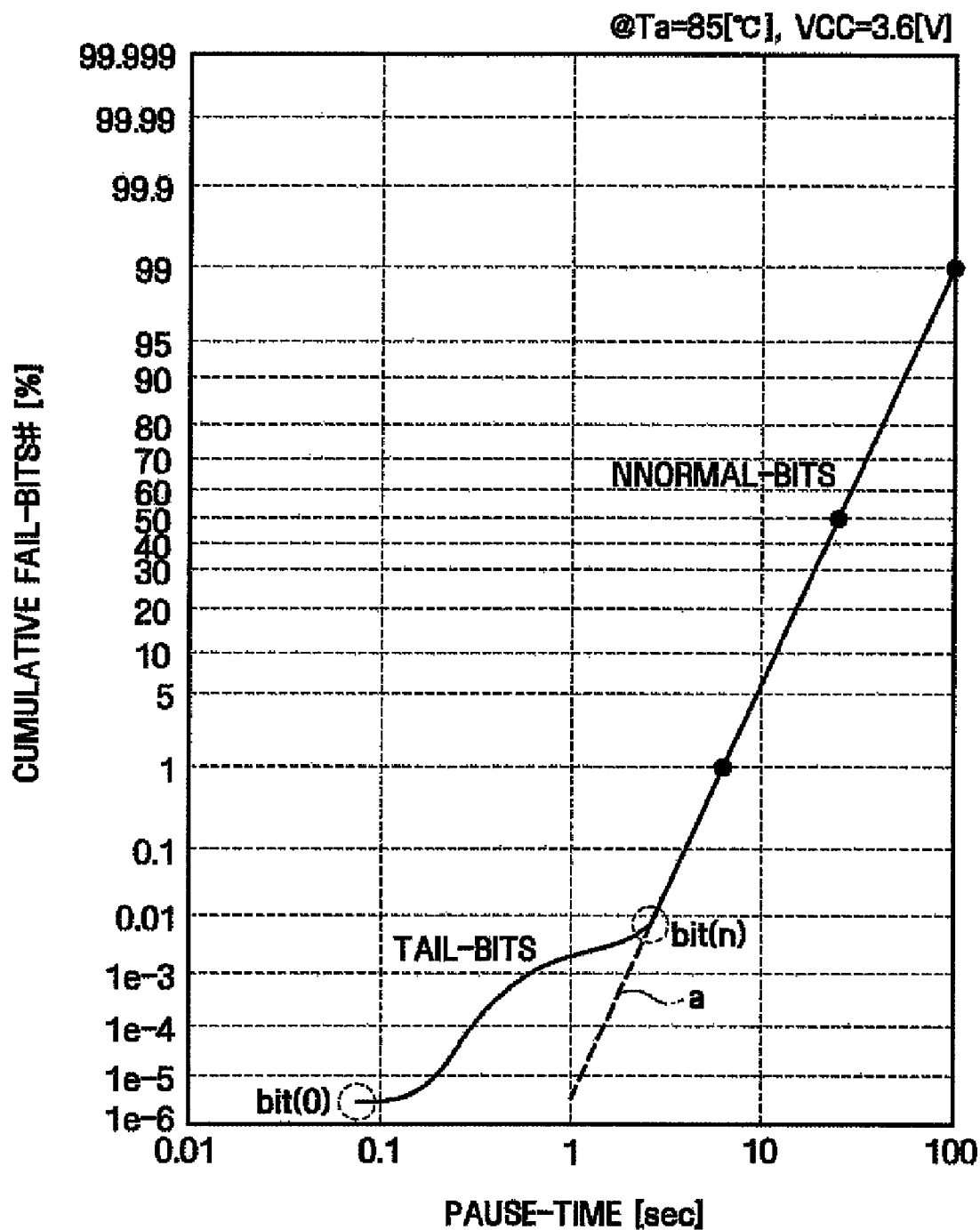
FIG. 6 is a pause refresh characteristic diagram showing the normalized number of accumulated error bits relative to a pause time.

The monitoring bits are selected in advance through testing and the addresses of the selected monitoring bits are stored in monitoring address storage unit 30. The monitoring bits may be selected in a tail-bits region, that is, a region including tail bits, of a pause refresh characteristic diagram shown in FIG. 6. Referring briefly to FIG. 6, the x axis represents a pause time and the y axis represents the normalized number of accumulated error bits. The tail-bits region denoted as a dotted line portion at reference area "a" is defined as a region where an error occurs earlier than a predicted pause time. That is, in the bits of the tail-bits region, a leakage current easily occurs according to a change in process, voltage, and temperature (PVT), as compared with the bits outside of the tail-bits region "a". Therefore, the characteristics of all of the data bits can be judged by monitoring only the bits of the tail-bits region.

Multiple monitoring bits can be selected in the tail-bits region such that the self refresh cycle tREF can be adjusted if a first monitoring bit has an error and a second monitoring bit does not have an error. Unlike the present embodiment of the invention, when monitoring is not performed separately in the tail-bits region, since the bits of the tail-bits region are more likely to have an error, the self refresh cycle tREF needs to be set sufficiently large such that none of the bits of the tail-bits region have an error. In contrast, the present embodiment of the invention corrects a predetermined number of data bits using the ECC bit with low power consumption and thus, the self refresh cycle tREF can be increased. In particular, a most leaky bit (bit(0)) and a least leaky bit (bit(n)) in the tail-bits region can be included. For example, the self refresh cycle tREF can be adjusted such that the most leaky bit (bit(0)) has an error and the least leaky bit (bit(n)) does not have an error.

Monitoring address storage unit 30 stores the addresses MA of the monitoring bits. Monitoring address storage unit 30 may be of a nonvolatile type, for example, the addresses may be stored using a fuse. Refresh cycle determining circuit 40 adjusts the self refresh cycle tREF depending on whether or not an error occurs in the monitoring bits detected by ECC engine 20. In operation, refresh cycle determining circuit 40 can be enabled in response to a refresh instruction signal PRFH from a refresh mode entry detecting circuit 50 which detects entry into the self refresh mode and generates refresh instruction signal PRFH. Refresh mode entry detecting circuit 50 detects the need to enter the self refresh mode in response to an instruction defined by a combination of multiple control signals /CS, /CAS, /RAS, /WE, CKE, and CLK and supplies the high-level refresh instruction signal PRFH to refresh cycle determining circuit 40. Specifically, if chip selection signal /CS, column address strobe signal /CAS, row address strobe signal /RAS, and clock enable signal CKE is low and a write enable signal /WE is high, refresh instruction signal PRFH goes high. If clock enable signal CKE is high, the refresh instruction signal PRFH becomes low which represents the end of the self refresh operation.

Refresh cycle determining circuit 40 sets an initial self refresh cycle tREF and supplies a refresh cycle determination signal CRFH to internal address generator 60. The internal address generator 60 generates a pulse for each operation cycle during the self refresh operation and generates counting addresses which sequentially increase in response to the operation cycle pulses. With a combination of the counting addresses, assigned row addresses RA1 to RAn are sequentially switched. Here, the operation cycle can be changed to correspond to the refresh cycle determination signal CRFH. Refresh cycle determining circuit 40 also supplies a timing signal TS to monitoring address storage unit 30 whenever a predetermined time .DELTA.t passes. The monitoring address storage unit 30 supplies the monitoring addresses MA to row decoder 12 and column decoder 16 in response to timing signal TS. Sense amplifier and write driver 14 supplies the monitoring bits corresponding to the monitoring addresses MA to ECC engine 20 which detects whether or not an error occurs in the monitoring bits. In this case, the refresh cycle determining circuit 40 supplies the refresh cycle determination signal CRFH adjusted according to the detection result of ECC engine 20 to internal address generator 60 so as to adjust the self refresh cycle tREF. Since the timing signal TS is supplied to monitoring address storage unit 30 whenever the predetermined time .DELTA.t passes, the self refresh cycle tREF is adjusted whenever the predetermined time .DELTA.t passes.

Figure 2:
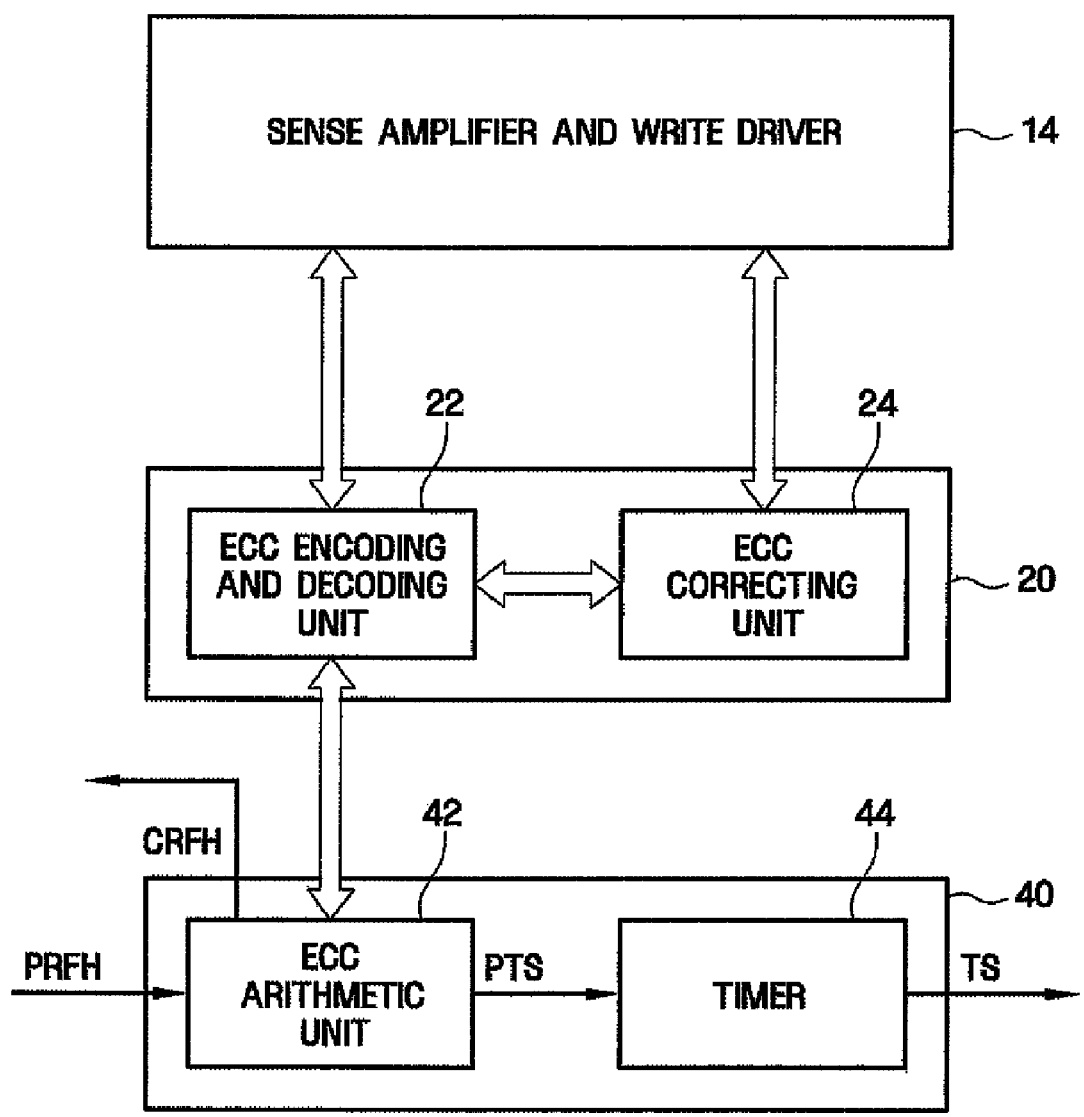
FIG. 2 is a block diagram illustrating a refresh cycle determining circuit and an ECC engine shown in FIG. 1.

Referring to FIG. 2, refresh cycle determining circuit 40 includes an ECC arithmetic unit 42 and a timer 44. ECC engine 20 includes an ECC encoding and decoding unit 22 and an ECC correcting unit 24. The ECC arithmetic unit 42 receives the refresh instruction signal PRFH and causes ECC encoding and decoding unit 22 to generate an ECC bit corresponding to the data bits using the data bits in memory array 10. The sense amplifier and write driver 14 writes the generated ECC bit into memory array 10. The ECC arithmetic unit 42 sets the initial self refresh cycle tREF and supplies refresh cycle determination signal CRFH corresponding to the initial self refresh cycle tREF to internal address generator 60. ECC arithmetic unit 42 then supplies a previous timing signal PTS to timer 44 which supplies the timing signal TS to the monitoring address storage unit 30 in response to the previous timing signal PTS whenever the predetermined time .DELTA.t passes. In this case, the predetermined time .DELTA.t is not a constant value, but may vary according to temperature or the application of memory. Therefore, the monitoring bits in the memory array 10 are read through the sense amplifier and write driver 14 whenever the predetermined time .DELTA.t passes. The ECC encoding and decoding unit 22 detects whether or not an error occurs in the read monitoring bits. The ECC arithmetic unit 42 analyzes the detection result of the ECC encoding and decoding unit 22 and supplies the refresh cycle determination signal CRFH for adjusting the self refresh cycle tREF to the internal address generator 60 again.

When the ECC arithmetic unit 42 determines that the self refresh mode is exited, the ECC arithmetic unit 42 causes ECC engine 20 to correct the error in the memory array 10. ECC encoding and decoding unit 22 reads the data bits and the ECC bit in memory array 10 so as to detect whether or not an error occurs. The ECC correcting unit 24 corrects the data bits using the ECC bit and the sense amplifier and write driver 14 rewrites the corrected data bits.

Figure 3:
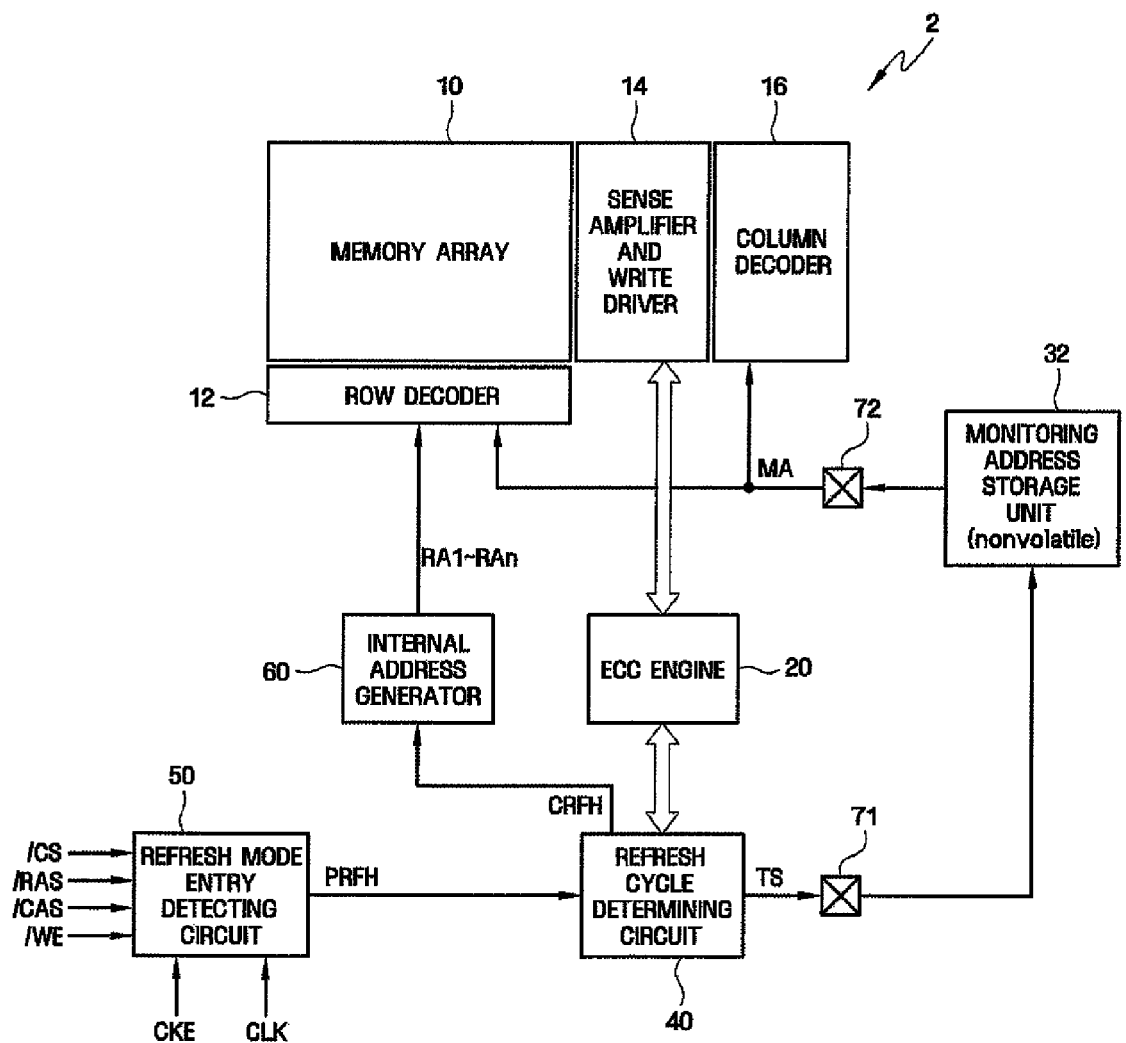
FIG. 3 is a circuit diagram illustrating a dynamic random access memory device according to another embodiment of the present invention.

Referring to FIG. 3, a dynamic random access memory device 2 utilizes a Read Only Memory (ROM) as monitoring address storage unit 32. Refresh cycle determining circuit 40 supplies the timing signal TS to monitoring address storage unit 32 through a predetermined control pin 71 and the monitoring address storage unit 32 supplies the monitoring addresses MA to row decoder 12 and column decoder 16 through predetermined address pin 72.

Figure 4:
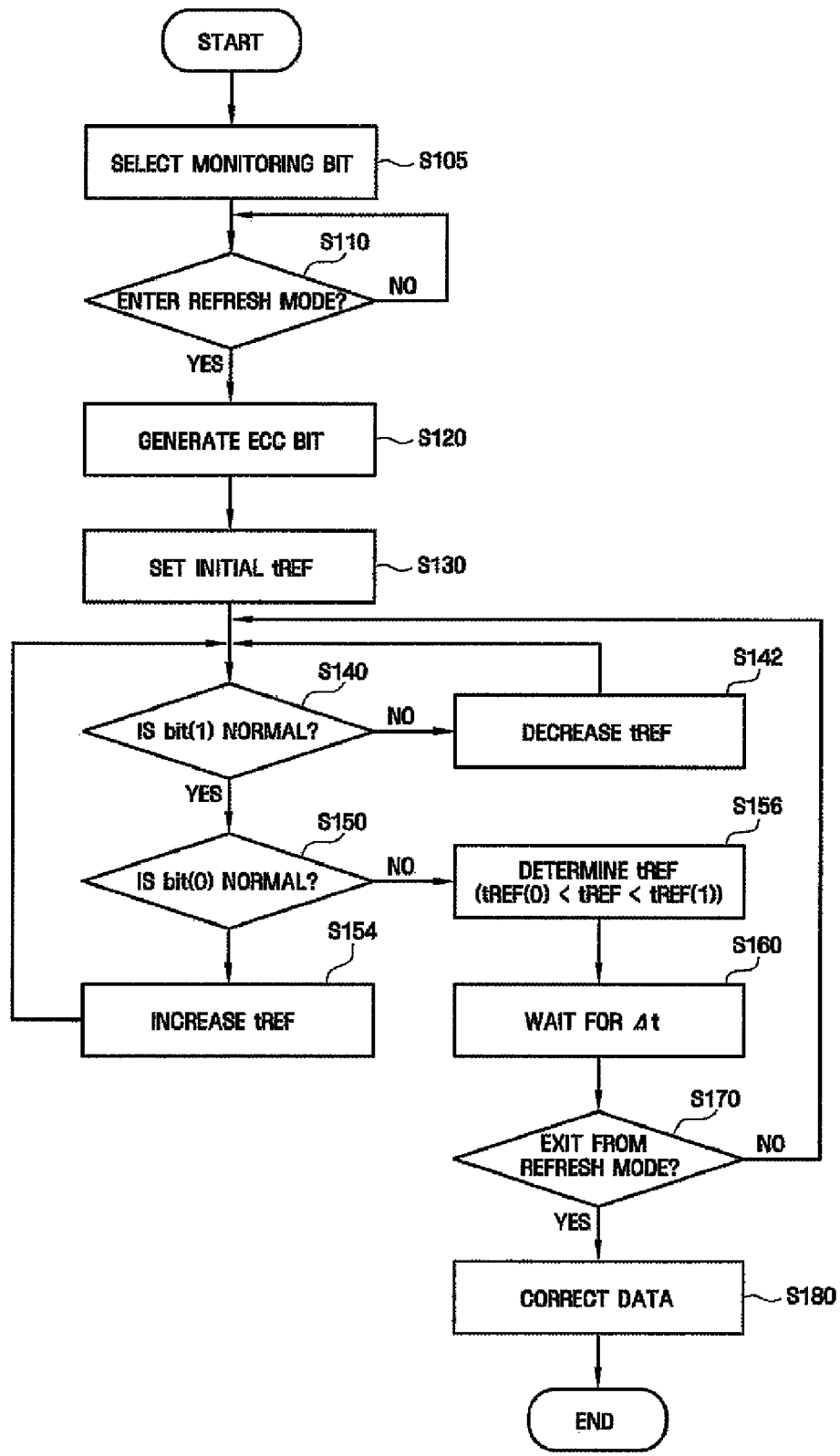
FIG. 4 is a flow chart illustrating a method of determining a refresh cycle of a dynamic random access memory device according to an embodiment of the present invention.

FIG. 4 is a flow chart illustrating a method of determining a refresh cycle of a dynamic random access memory device where two bits are the selected monitoring bits. Reference is also made to FIG. 1 as needed. Monitoring bits are selected and the monitoring addresses MA are stored in monitoring address storage unit 30 at step S105. These monitoring bits can be selected in the tail-bits region of the pause refresh characteristic diagram and may be, for example, the most leaky bit (bit(0)) and the least leaky bit (bit(1)) in the tail-bits region, but are not limited thereto. A determination is made at step S110 whether or not to enter the self refresh mode. Specifically, the refresh mode entry detecting circuit 50 detects entry to the self refresh mode in response to an instruction defined by the combination of the multiple control signals /CS, /CAS, /RAS, /WE, CKE, and CLK and supplies the refresh instruction signal PRFH to refresh cycle determining circuit 40. The ECC (Error correction code) bit is generated at step S120 where refresh cycle determining circuit 40 causes ECC engine 20 to generate an ECC bit corresponding to the data bits from memory array 10.

At step S130, refresh cycle determining circuit 40 sets the initial self refresh cycle tREF and supplies the refresh cycle determination signal CRFH corresponding to the initial self refresh cycle tREF to internal address generator 60. The internal address generator 60 sequentially changes the row addresses RA1 to RAn for each operation cycle, such that the self refresh operation is performed. A determination is made at step S140 whether or not the monitoring bit (bit(1)) is normal. Specifically, if an error occurs in bit (bit(1)), the self refresh cycle tREF is decreased at step S142. Even though bit(1) is less leaky as compared with bit(0), since an error occurs the occurrence of the error is reduced by decreasing the self refresh cycle tREF. After the self refresh cycle tREF decreases, a determination is made again whether or not the monitoring bit (bit(1)) is normal. If the monitoring bit (bit(1)) is normal, step S150 determines if monitoring bit (bit(0)) is normal. Specifically, if bit(0) is normal, the self refresh cycle tREF increases at step S154. Even though bit bit(0) is more leaky as compared with bit(1), since it is normal (that is, both of bit(0) and bit(1) are normal), it is determined that the self refresh cycle tREF is too short, and thus the self refresh cycle tREF increases.

If an error occurs in the monitoring bit bit(0), the self refresh cycle tREF is fixed at step S156. That is, the self refresh cycle tREF is set to satisfy the condition tREF(0) <tREF<tREF(1). Here, tREF(1) and tREF(0) means self refresh cycles that cause errors to occur in bit(1) and bit(0), respectively. When the self refresh cycle tREF is determined, the refresh cycle determining circuit 40 supplies the refresh cycle determination signal CRFH to internal address generator 60 such that self refresh operation is performed based on the determined self refresh cycle tREF. At step S160, the process waits for the predetermined time DELTA.t. Here, the predetermined time .DELTA.t is not a constant value, but can vary according to temperature or the application of memory. Next, a determination is made at step S170 whether or not the self refresh mode is to be exited. Specifically, for example, if clock enable signal CKE becomes high, the refresh instruction signal PRFH becomes low which represents the end of the self refresh operation. At step S180, data is corrected before the self refresh mode is exited. ECC engine 20 corrects the data bits using the ECC bit in memory array 10. In this manner, the self refresh cycle tREF can be actively changed with respect to changes in PVT since a determination is made whether or not the error occurs in the prescribed multiple monitoring bits whenever the predetermined time .DELTA.t passes and the self refresh cycle tREF is adjusted. Further, since the self refresh cycle tREF is extended to the maximum refresh cycle, standby power consumption of the dynamic random access memory device is minimized.

Figure 5:
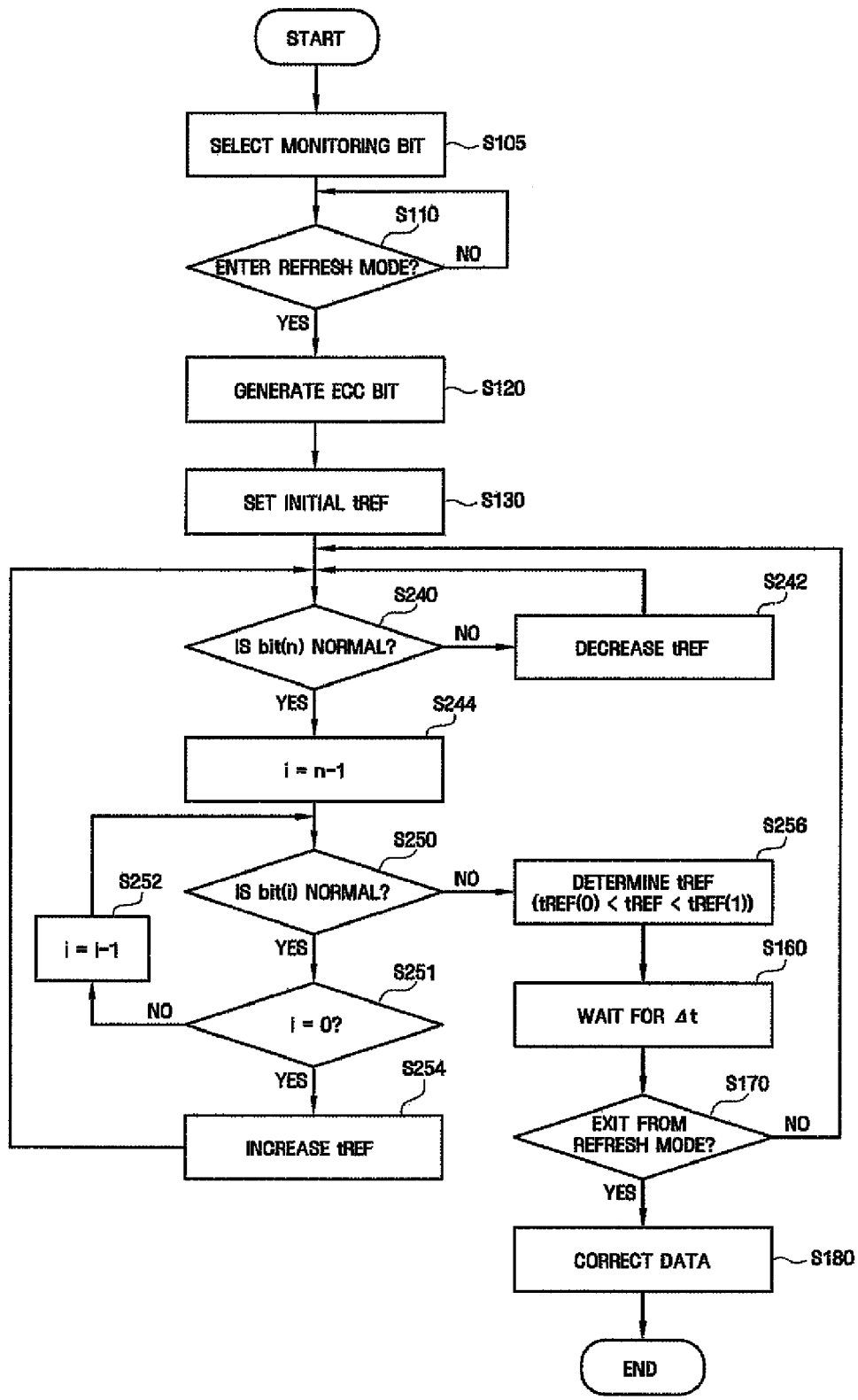
FIG. 5 is a flow chart illustrating a method of determining a refresh cycle of a dynamic random access memory device according to another embodiment of the present invention.

FIG. 5 is a flow chart illustrating a method of determining a refresh cycle of a dynamic random access memory device. Monitoring bits are selected and the monitoring addresses MA are stored in monitoring address storage unit 30 at step S105. The multiple monitoring bits are selected from the tail-bits region of the pause refresh characteristic diagram and multiple monitoring bits are represented as bit(0), bit(1), ... , and bit(n) in a more leaky order. At step S110, it is detected whether or not the self refresh mode is to be entered, and an ECC bit is generated at step S120. Subsequently, the initial self refresh cycle tREF is set at step S130. A determination is made at step S240 to determine whether or not the monitoring bit (bit(n)) is normal. When the error occurs in bit(n), the self refresh cycle tREF decreases at step S242. When bit(n) is normal, i=n−1 is substituted with n at step S244.

At step S250, a determination is made whether or not bit(i) is normal (that is, whether or not bit(n−1) is normal). If bit(n−1) is normal, a check is performed to determine if i=0 at step S251, or in other words, whether or not there are remaining bits to be monitored. When there are remaining bits to be monitored, the equation i=i−1 is performed at step S252, and it is concluded whether or not bit(i) is normal (that is, whether or not bit(n−2) is normal) at step S250. When all of the monitoring bits bit(0), bit(1), ... , and bit(n) are normal, the self refresh cycle tREF increases at step S254. If an error occurs in bit(i), the self refresh cycle tREF is corrected at step S256. That is, the self refresh cycle tREF is determined to satisfy the condition tREF(i)<tREF<tREF(i+1) where tREF (i+1) and tREF(i) means self refresh cycles that cause errors to occur in bit(i+1) and bit(i), respectively. Next, the process waits for the predetermined time .DELTA.t step S160 and it is determined, at step S170, whether or not the self refresh mode is to be exited. Subsequently, data is corrected before the self refresh mode is exited at step S180.

Alternatively, the process may also be configured to determine whether or not an error occurs in the multiple monitoring bits selected in the tail-bits region in a non-leaky sequence; a leaky sequence or in randomly selected monitoring bits. This determination may also be performed using a combination of the non-leaky and leaky sequences.

In this manner, since the self refresh cycle of the memory device is adjusted by detecting for each predetermined time, whether or not an error of the prescribed multiple monitoring bits occurs, the self refresh cycle can be actively changed according to the change in PVT. In addition, since the self refresh cycle extends to the maximum prescribed time period, power consumption for the device is minimized.

Figure 7:
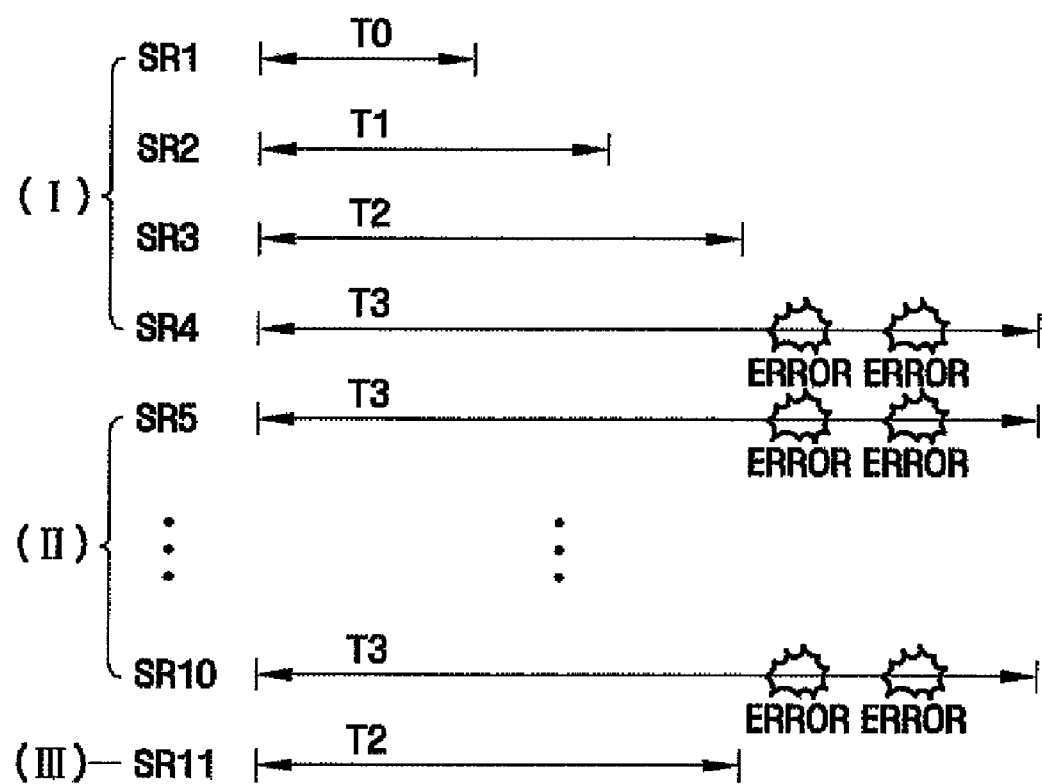
FIG. 7 is a diagram illustrating a method of determining a refresh cycle of a dynamic random access memory device according to another embodiment of the present invention.

FIG. 7 is a diagram illustrating a method of determining a refresh cycle of a dynamic random access memory device according to another embodiment of the present invention.

Referring to FIG. 7, one or more monitoring bits are selected during a self refresh period in the present embodiment. On the other hand, in the previous embodiment of the present invention (see FIG. 1), one or more monitoring bits are selected in advance through testing, and the addresses of the selected monitoring bits are stored in the monitoring address storage unit 30 of a nonvolatile type.

In the present embodiment, when the self refresh period begins, one or more monitoring bits are selected during the first few self refresh cycles (e.g., first through fourth self refresh cycles SR1 through SR4) at step I. Step I is referred to as an auto sampling mode (ASM). During a self refresh cycle, all word lines of a memory array sequentially perform a self refresh operation.

Specifically, during the first self refresh cycle SR1, it is determined whether data bits stored in the memory array have errors by using the data bits and ECC bits corresponding to the data bits. For example, data bits read from the memory array may be corrected by using ECC bits corresponding to the data bits. When the corrected data bits are identical to the data bits before being corrected (that is, the data bits read from the memory array), the read data bits may not have errors. However, when the corrected data bits are different from the read data bits, it may be determined that the read data bits have errors. The data bits having errors may be corrected through a write-back operation, which will be described later. The length of the first self refresh cycle SR may be shortest (that is, T0 in FIG. 7).

When no errors occur in the data bits, the length of the second self refresh cycle SR2 becomes T1 which is longer than the length (T0) of the first self refresh cycle SR1. Again, during the second self refresh cycle SR2, it is determined whether the data bits stored in the memory array have errors by using the data bits and the ECC bits corresponding to the data bits. Since the second self refresh cycle SR2 is longer than the first self refresh cycle SR1, there is a higher possibility that errors occur in the data bits during the second self refresh cycle SR2.

In this way, the length of the self refresh cycle is continuously increased until errors occur in certain data bits. For example, the length of the third self refresh cycle SR3 becomes T2 which is longer than the length (T1) of the second self refresh cycle SR2, and the length of the fourth self refresh cycle SR4 becomes T3 which is longer than the length (T2) of the third self refresh cycle SR3. In FIG. 7, errors occur during the fourth self refresh cycle SR4.

Figure 8:
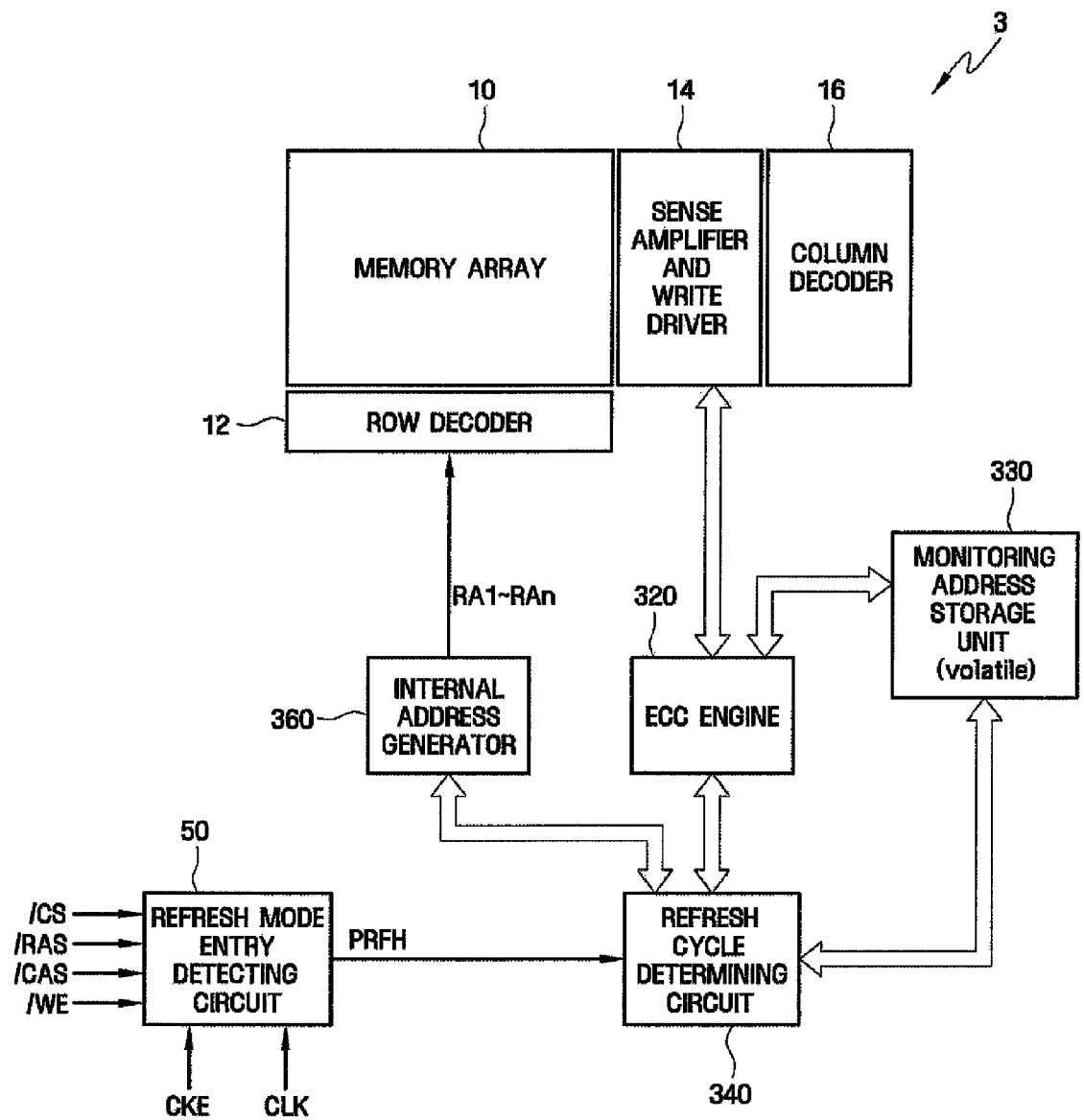
FIG. 8 is a block diagram illustrating a dynamic random access memory device according to another embodiment of the present invention.

When an error occurs in a data bit, the data bit having the error and an ECC bit corresponding to the data bit are defined as monitoring bits, and the addresses of the monitoring bits are stored in a monitoring address storage unit 330 (see FIG. 8).

Here, when errors occur in some of the data bits stored in the memory array during the fourth self refresh cycle SR4, not all of the data bits having the errors and ECC bits corresponding to the data bits may be defined as monitoring bits. That is, only some of the data bits having the errors and ECC bits corresponding to the data bits may be defined as monitoring bits. For example, only several data bits having errors may be defined as monitoring bits. This is because data bits having errors are highly likely to correspond to a region having poor data retention characteristics in the dynamic random access memory device.

In FIG. 7, a case where the length of the self refresh cycle is continuously increased because no monitoring bits are selected during the first through third self refresh cycles SR1 through SR3 is illustrated as an example. However, the present invention is not limited thereto. For example, when a data bit having an error is detected during the first self refresh cycle SR1, a monitoring bit may be selected during the first self refresh cycle SR1.

In fifth through tenth self refresh cycles SR5 through SR10 which are performed after step I (ASM), it is determined at step II whether one or more monitoring bits selected at step I have errors.

Specifically, not all of the data bits stored in the memory array are checked to determine whether the data bits have errors. Instead, only some of the data bits stored in the memory array are checked to determine whether the checked data bits have errors, and the length of the self refresh cycle is adjusted based on the determination result. This is because large power consumption is required when all of the data bits stored in the memory array are checked to determine whether the data bits have errors.

At step III, the length of an eleventh self refresh cycle SR11 is adjusted according to whether the selected monitoring bits have errors.

For example, when errors continuously occur in the selected monitoring bits during the fifth through tenth self refresh cycles SR5 through SR10, it is determined that the current length of the self refresh cycle is not appropriate. Thus, the current length of the self refresh cycle is reduced to T2 as shown in FIG. 7. That is, the eleventh self refresh cycle SR11 is shorter than the fifth through tenth self refresh cycles SR5 through SR10.

Although not shown in the drawing, when errors do not occur during the fifth through tenth self refresh cycles SR5 through SR10, it may be determined that the current length of the self refresh cycle should be increased. Thus, the current length of the self refresh cycle may be increased so that the eleventh self refresh cycle SR11 is longer than the fifth through tenth self refresh cycles SR5 through SR10.

In FIG. 7, the selected monitoring bits are checked during six self refresh cycles (i.e., the fifth through tenth self refresh cycles SR5 through SR10) to determine whether they continuously have errors. However, the present invention is not limited thereto. For example, the selected monitoring bits may be checked during one self refresh cycle or more than seven self refresh cycles to determine whether they continuously have errors.

In summary, one or more monitoring bits may be selected during first through $n^{th}$ self refresh cycles ("n" is a natural number equal to or greater than one) as follows.

When "n" is a natural number greater than two, it is determined during an $a^{th}$ self refresh cycle ("a" is a natural number which is equal to or greater than one and less than "n") whether data bits stored in a memory array have errors by using the data bits and ECC bits corresponding to the data bits.

When no errors occur in the data bits, it is determined during an $(a+1)^{th}$ self refresh cycle whether the data bits stored in the memory array have errors by using the data bits and the ECC bits corresponding to the data bits. Here, the $(a+1)^{th}$ self refresh cycle is longer than the $a^{th}$ self refresh cycle.

When errors occur in some of the data bits, the data bits having the errors and ECC bits corresponding to the data bits are defined as monitoring bits, and addresses of the monitoring bits are stored in a monitoring address storage unit.

Figure 9:
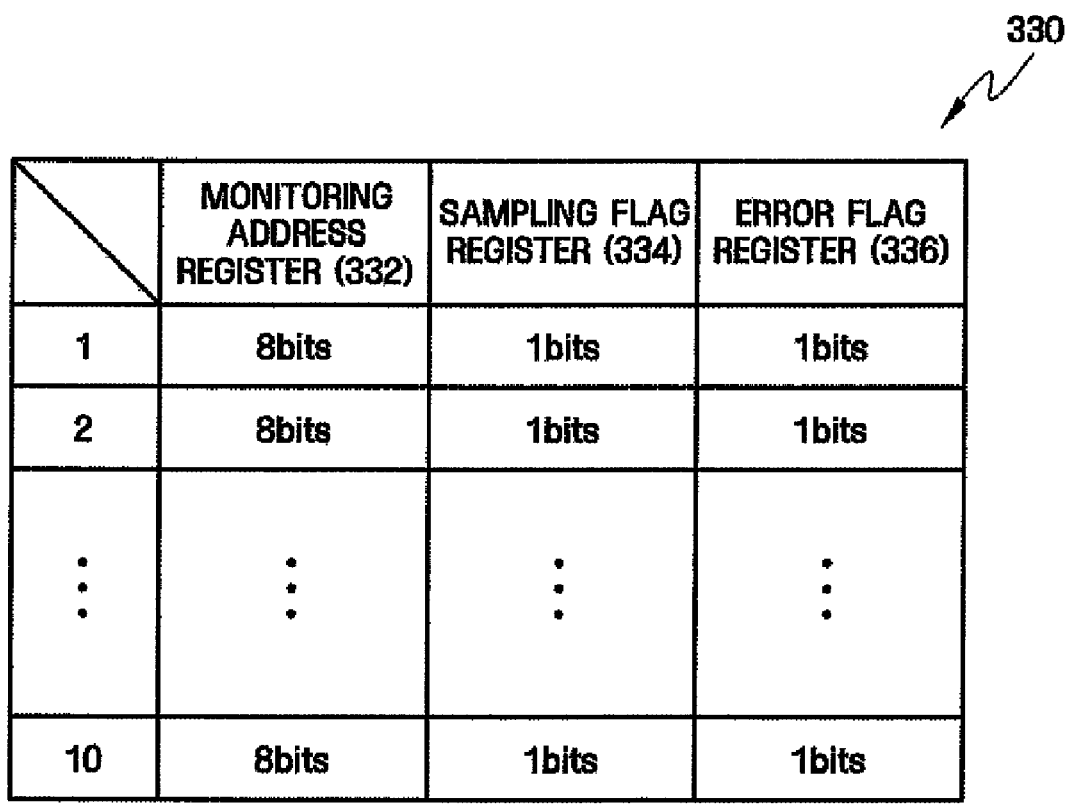
FIG. 9 is a diagram illustrating a monitoring address storage unit shown in FIG. 8.
Figure 10:
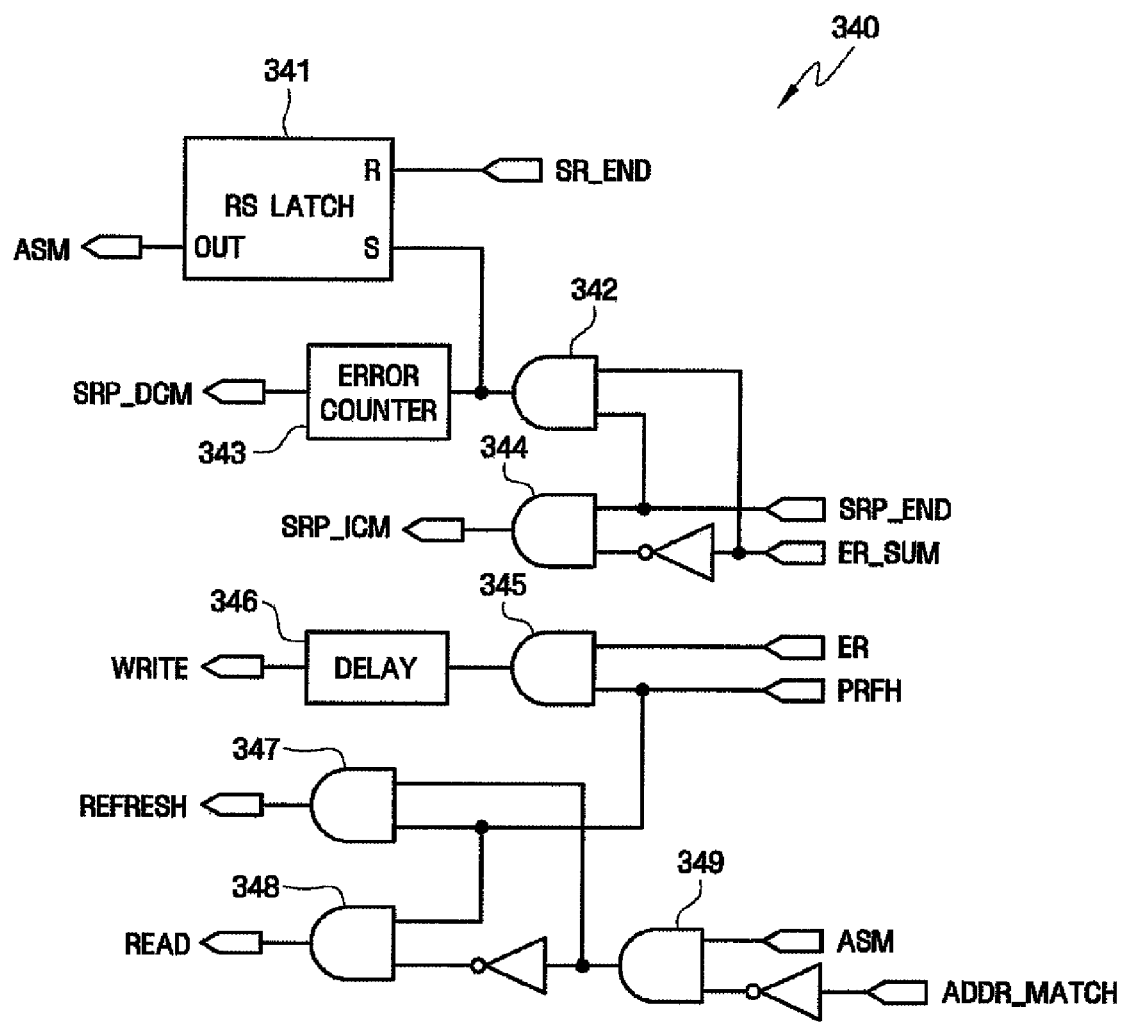
FIG. 10 is a diagram illustrating a refresh cycle determining circuit shown in FIG. 8.

FIG. 8 is a block diagram illustrating a dynamic random access memory device 3 according to another embodiment of the present invention. FIG. 8 is a specific example which implements the refresh cycle determination method described above with reference to FIG. 7. FIG. 9 is a diagram illustrating a monitoring address storage unit 330 shown in FIG. 8. FIG. 10 is a diagram illustrating a refresh cycle determining circuit 340 shown in FIG. 8. For simplicity, elements substantially identical to those described above with reference to FIG. 1 are indicated by like reference numerals, and thus their description will be omitted.

Referring to FIG. 8, the dynamic random access memory device 3 according to the present embodiment includes a memory array 10, an ECC engine 320, the monitoring address storage unit 330, and the refresh cycle determining circuit 340.

The ECC engine 320 selects one or more monitoring bits and detects whether the selected monitoring bits have errors during a self refresh period (as described above with reference to FIG. 7).

Specifically, the ECC engine 320 selects one or more monitoring bits during first through $n^{th}$ self refresh cycles ("n" is a natural number equal to or greater than one) and detects whether the selected monitoring bits have errors during (n+1)$^{th}$ through $m^{th}$ self refresh cycles ("m" is a natural number equal to or greater than n+1).

When data bits stored in the memory array 10 are checked to select one or more monitoring bits, if no errors occur in the data bits during an $a^{th}$ self refresh cycle, it is determined during an $(a+1)^{th}$ self refresh cycle whether the data bits stored in the memory array 10 have errors by using the data bits and ECC bits corresponding to the data bits. In this case, the $(a+1)^{th}$ self refresh cycle is longer than the $a^{th}$ self refresh cycle. When data bits having errors are detected, the data bits and ECC bits corresponding to the data bits are defined as monitoring bits, and addresses of the monitoring bits are stored in the monitoring address storage unit 330 (that is, a plurality of monitoring address registers 332).

The monitoring address storage unit 330 stores addresses of one or more selected monitoring bits. The monitoring address storage unit 330 may include the monitoring address registers 332, a plurality of sampling flag registers 334, and a plurality of error flag registers 336.

The monitoring address registers 332 store a plurality of monitoring addresses corresponding to a plurality of monitoring bits, respectively.

The sampling flag registers 334 correspond to the monitoring address registers 332, respectively, and store sampling flags indicating whether the monitoring addresses are stored in the monitoring address registers 332, respectively. For example, when a monitoring address is stored in one of the monitoring address registers 332, the sampling flag may be one. Otherwise, the sampling flag may be zero.

The error flag registers 336 correspond to the monitoring address registers 332, respectively, and store error flags indicating whether the monitoring bits, which correspond respectively to the monitoring addresses stored in the monitoring address registers 332, have errors. For example, when a monitoring bit, which corresponds to a monitoring address stored during a refresh cycle (e.g., the fifth self refresh cycle SR5), has an error, the error flag may be one. Otherwise, the error flag may be zero.

In FIG. 9, ten monitoring address registers 330, ten sampling flag registers 334, and ten error flag registers 336 are illustrated. However, the present invention is not limited thereto. When necessary, the number of the monitoring address registers 330, the number of the sampling flag registers 334, and the number of the error flag registers 336 may be more than or less than ten. In addition, each of the monitoring address registers 332, each of the sampling flag registers 334, and each of the error flag registers have 8 bits, 1 bit, and 1 bit, respectively. However, the present invention is not limited thereto.

In FIG. 1, since the addresses of monitoring bits selected through testing are stored in the monitoring address storage unit 30, the monitoring address storage unit 30 may be of a nonvolatile type. However, in FIG. 8, one or more monitoring bits are selected during each self refresh cycle (that is, ASM), and monitoring addresses of the monitoring bits are stored. Thus, the monitoring address storage unit 330 may not necessarily be of a nonvolatile type. That is, the monitoring address storage unit 330 may also be of a volatile type.

The refresh cycle determining circuit 340 adjusts a self refresh cycle according to whether monitoring bits have errors.

Specifically, the refresh cycle determining circuit 340 adjusts an $(m+1)^{th}$ self refresh cycle according to whether one or more monitoring bits detected during the $(n+1)^{th}$ through $m^{th}$ self refresh cycles ("m" is a natural number equal to or greater than n+1) have errors.

Referring to FIG. 10, the refresh cycle determining circuit 340 may include an RS latch 341, AND gates 342, 344, 345, 347, 348 and 349, an error counter 343, and a delay unit 346. In addition, the following signals may be used.

A signal SR_END indicates the end of a self refresh operation, and a signal SRP_END indicates the end of a self refresh cycle. The signal SRP_END may be provided by, e.g., an internal address generator 360.

A signal ER_SUM may be an OR combination signal of error flags stored in the error flag registers 336. That is, when any one of the error flags is one, the signal ER_SUM is one. A signal ER is generated whenever the ECC engine 320 detects an error. When the ECC engine 320 detects an error, the signal ER is one.

A signal ADDR_MATCH indicates whether an address, at which the self refresh operation is currently being performed, matches an address stored in one of the monitoring address registers 332. When the addresses match, the signal ADDR_MATCH is one.

A signal ASM indicates the end of an ASM operation (that is, monitoring addresses are stored in the monitoring address registers 332). When the ASM operation ends, the signal ASM becomes one.

A signal SRP_DCM instructs a decrease of the self refresh cycle, and a signal SRP_ICM instructs an increase of the self refresh cycle. The signals SRP_DCM and SRP_ICM are transmitted to the internal address generator 60 so as to adjust the self refresh cycle.

A signal WRITE instructs a wrote-back operation. That is, in response to the signal WRITE, a data bit having an error is corrected by using an ECC bit corresponding to the data bit, and then the corrected data bit is re-written. A signal REFRESH simply instructs a self refresh operation (without the write-back operation). A signal READ instructs monitoring data to be read in order to determine whether monitoring data has an error.

The self refresh cycle may be increased or reduced as follows. When a self refresh cycle ends, the signal SRP_END becomes one. When one or more errors occurred during the self refresh cycle, the signal ER_SUM becomes one. Accordingly, an output of the AND gate 342 becomes one. In this case, the error counter 343 counts the number of times that the output of the AND gate 342 becomes one. When the number of times that the output of the AND gate 342 becomes one exceeds a predetermined value, the error counter 343 enables the signal SRP_DCM. For example, when errors occurred during six cycles (as described above with reference to FIG. 7), the signal SRP_DCM may be enabled. Since the signal SRP_DCM is enabled, the length of the self refresh cycle is reduced.

On the other hand, when the signal SRP_END becomes one as the self refresh cycle ends, if the signal ER_SUM becomes zero since no errors occurred during the self refresh cycle, the signal SRP_ICM is enabled. That is, since the signal SRP_ICM is enabled, the length of the self refresh cycle is increased.

The self refresh operation is adjusted as follows. When an address, at which the self refresh operation is currently being performed, matches an address stored in a corresponding one of the monitoring address registers 332, the signal ADDR_MATCH becomes one. In this case, the signal READ is enabled. Accordingly, data is read from the address at which the self refresh operation is currently being performed, and the ECC engine 320 determines whether the data has an error.

On the other hand, when the address, at which the self refresh operation is currently being performed, does not match the address stored in the corresponding one of the monitoring address registers 332, the signal ADDR_MATCH becomes zero. In this case, the signal REFRESH is enabled. Accordingly, the ECC engine 320 does not determine whether the data has an error. Instead, the ECC engine 320 simply refreshes the data of the address at which the self refresh operation is currently being performed.

When the signal ER is one, a data bit corresponding to the address, at which the self refresh operation is currently being performed, has an error. Thus, the signal WRITE is enabled after being delayed by the delay unit 346 for a predetermined period of time, and the corrected data is written back to the data bit having an error.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of determining a refresh cycle of a dynamic random access memory device, the method comprising:
    selecting one or more monitoring bits during first through n-th self refresh cycles, where "n" is a natural number greater than two, and selecting the monitoring bits comprises;
        determining during an a-th self refresh cycle whether data bits stored in a memory array have errors using the data bits and error correction code (ECC) bits corresponding to the data bits, where "a" is a natural number which is equal to or greater than one and less than "n", and
        determining during an (a+1)-th self refresh cycle whether the data bits stored in the memory array have errors using the data bits and the ECC bits corresponding to the data bits when no errors occurred in the data bits during the a-th self refresh cycle, wherein the (a+1)-th self refresh cycle is longer than the a-th self refresh cycle;
    detecting whether the monitoring bits have errors during (n+1)-th through m-th self refresh cycles, where "m" is a natural number equal to or greater than n+1; and
    adjusting an (m+1)-th self refresh cycle according to whether the monitoring bits have errors.

2. The method of claim 1, wherein the selecting of the monitoring bits further comprises, when data bits having errors are detected, defining the data bits having the errors as monitoring bits and storing addresses of the monitoring bits in a monitoring address storage unit.

3. The method of claim 1, wherein, in the adjusting of the (m+1)-th self refresh cycle, the (m+1)-th self refresh cycle is reduced when at least some of the monitoring bits have errors.

4. The method of claim 1, wherein, in the adjusting of the (m+1)-th self refresh cycle, the (m+1)-th self refresh cycle is increased when the monitoring bits are normal.

5. A dynamic random access memory device comprising:
- an ECC engine configured to select one or more monitoring bits during a self refresh period and detect whether the selected monitoring bits have errors,
- wherein the ECC engine is further configured to select the monitoring bits during first through n-th self refresh cycles, detect whether the selected monitoring bits have errors during (n+1)-th through m-th self refresh cycles, and adjust an (m+1)-th self refresh cycle according to whether the selected monitoring bits have errors, wherein "n" is a natural number equal to or greater than one, and "m" is a natural number equal to or greater than n+1;
- a monitoring address storage unit configured to store monitoring addresses of the selected monitoring bits; and
- a refresh cycle determining circuit configured to adjust a self refresh cycle according to whether the selected monitoring bits have errors.

6. The memory device of claim 5, wherein "n" is a natural number greater than two, and the ECC engine is further configured to determine during an a-th self refresh cycle whether data bits stored in a memory array have errors using the data bits and ECC bits corresponding to the data bits and, when no errors occurred in the data bits during the a-th self refresh cycle, the ECC engine is further configured to determine during an (a+1)-th self refresh cycle whether the data bits stored in the memory array have errors using the data bits and the ECC bits corresponding to the data bits, wherein "a" is a natural number which is equal to or greater than one and less than "n", and the (a+1)-th self refresh cycle is longer than the a-th self refresh cycle.

7. The memory device of claim 5, wherein the refresh cycle determining circuit is further configured to reduce the (m+1)-th self refresh cycle when at least some of the monitoring bits have errors and to increase the (m+1)-th self refresh cycle when the monitoring bits are normal.

8. The memory device of claim 5, wherein the monitoring address storage unit comprises:
- a plurality of monitoring address registers storing the monitoring addresses;
- a plurality of sampling flag registers corresponding to the monitoring address registers, respectively, and storing sampling flags, each indicating whether one of the monitoring addresses is stored in a corresponding one of the monitoring address registers; and
- a plurality of error flag registers corresponding to the monitoring address registers, respectively, and storing error flags, each indicating whether one of the monitoring bits, which correspond respectively to the monitoring addresses stored in the monitoring address registers, has an error.

9. The memory device of claim 5, wherein the monitoring address storage unit is of a volatile type.

* * * * *